(12) United States Patent
Gong

(10) Patent No.: US 10,838,397 B2
(45) Date of Patent: Nov. 17, 2020

(54) COMPLEMENT METHOD AND SYSTEM OF THE IDENTIFICATION NUMBER USED IN THE ENGRAVING MACHINE

(71) Applicant: Wuhan China Star Optoelectronics Semiconductor Display Technology Co., Ltd., Hubei (CN)

(72) Inventor: Chengbo Gong, Hubei (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 359 days.

(21) Appl. No.: 15/576,901

(22) PCT Filed: Oct. 9, 2017

(86) PCT No.: PCT/CN2017/105328
§ 371 (c)(1),
(2) Date: Nov. 27, 2017

(87) PCT Pub. No.: WO2019/015130
PCT Pub. Date: Jan. 24, 2019

(65) Prior Publication Data
US 2019/0064775 A1    Feb. 28, 2019

(30) Foreign Application Priority Data
Jul. 20, 2017  (CN) .......................... 2017 1 0598152

(51) Int. Cl.
*G05B 19/4093*    (2006.01)
(52) U.S. Cl.
CPC .................. *G05B 19/40931* (2013.01); *G05B 2219/31304* (2013.01)

(58) Field of Classification Search
CPC .... G05B 19/40931; G05B 2219/31304; B44B 3/009; G09F 23/00; G09F 9/00;
(Continued)

(56) References Cited

U.S. PATENT DOCUMENTS

| 5,832,415 A * | 11/1998 | Wilkening ........... B23K 26/382 |
| | | 702/86 |
| 2003/0007286 A1* | 1/2003 | Tsujimoto ................ B41M 5/24 |
| | | 360/234.3 |

(Continued)

FOREIGN PATENT DOCUMENTS

| CN | 103529651 A | 1/2014 |
| CN | 104573687 A | 4/2015 |

(Continued)

*Primary Examiner* — Christopher E. Everett
(74) *Attorney, Agent, or Firm* — Hemisphere Law, PLLC; Zhigang Ma

(57) ABSTRACT

The present disclosure provides an ID number complement method for a engraving machine, including the steps of: sequentially acquiring a first distance a and a second distance g of a character located in a first digit of an identification number to an edge of an identification area in each identification area; respectively subtracting the first distance a and the second distance g from a first preset value a' and a second preset value g', and acquiring an offset information in X-axis direction and Y-axis direction of the identification number in each identification area. The disclosure also provides an ID number complement system for an engraving machine, including: a measuring device, a statistical process control system and an engraving machine. Compared with the prior art, the automatic filling of the engraving machine is realized, and the working efficiency is improved by the above method.

16 Claims, 2 Drawing Sheets

(58) Field of Classification Search
CPC .......... G06K 9/325; H01L 2223/54406; H01L 2223/54486; H01L 2223/54473; H01L 2223/54433; H01L 23/544
See application file for complete search history.

(56) References Cited

U.S. PATENT DOCUMENTS

| | | | |
|---|---|---|---|
| 2004/0031779 A1* | 2/2004 | Cahill | B23K 26/04 219/121.83 |
| 2004/0104202 A1* | 6/2004 | Downes | B23K 26/032 219/121.8 |
| 2004/0238636 A1* | 12/2004 | Marx | G01B 11/02 235/454 |
| 2005/0205778 A1* | 9/2005 | Kitai | B23K 26/032 250/309 |
| 2012/0074107 A1* | 3/2012 | Berthe | G01J 3/28 219/121.69 |
| 2013/0186871 A1* | 7/2013 | Suzuki | B23K 26/04 219/121.77 |
| 2015/0109596 A1* | 4/2015 | Huang | G03F 7/70425 355/67 |
| 2016/0295207 A1* | 10/2016 | Yoshida | H04N 5/142 |

FOREIGN PATENT DOCUMENTS

| | | |
|---|---|---|
| CN | 104637395 A | 5/2015 |
| CN | 106017313 A | 10/2016 |
| CN | 106646973 A | 5/2017 |
| KR | 20120089109 A | 8/2012 |

* cited by examiner

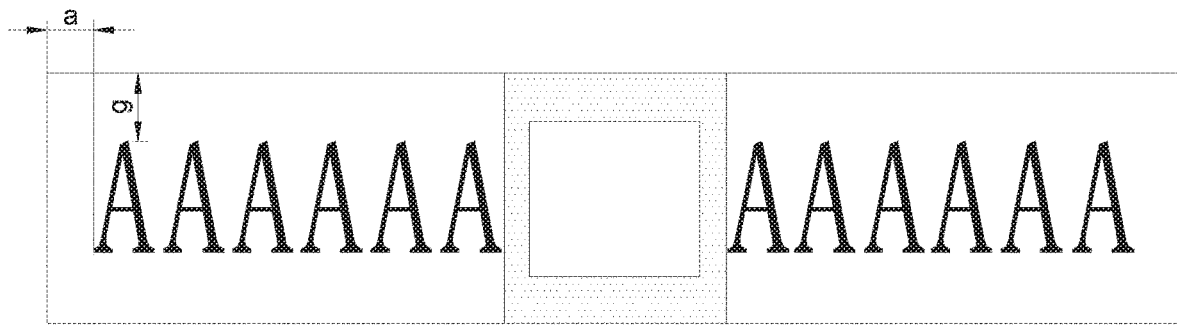

Fig. 1

```
Sequentially acquiring a first distance a and a second distance g
of a character located in a first digit of an identification number
to an edge of an identification area in each identification area
                              │
                              ▼
Respectively substracting the first distance a and the second
distance g from a first preset value a' and a second preset value
g', acquiring an offset information in X-axis direction and Y-axis
direction of the identification number in each identification area
                              │
                              ▼
Outputting the offset information and an identification area
        number corresponding to the offset information
```

Fig. 2

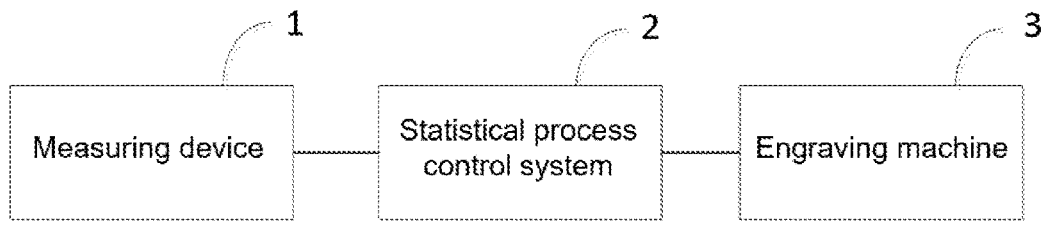

Fig. 3

|  | Δ X | Δ Y |
|---|---|---|
| 1 |  |  |
| 2 |  |  |
| 3 |  |  |
| . |  |  |
| . |  |  |
| 500 |  |  |

Fig. 4

COMPLEMENT METHOD AND SYSTEM OF THE IDENTIFICATION NUMBER USED IN THE ENGRAVING MACHINE

RELATED APPLICATIONS

The present application is a National Phase of International Application Number PCT/CN2017/105328, filed Oct. 9, 2017, and claims the priority of China Application No. 201710598152.X, filed Jul. 20, 2017.

FIELD OF THE DISCLOSURE

The present disclosure relates to a display panel production technology, and more particularly to a complement method and system of an identification number used in an engraving machine.

BACKGROUND OF THE DISCLOSURE

During the production of thin film transistor substrate, each unit (chip, array substrate unit) on the glass substrate is assigned an ID number (identification number), The ID number is mainly used for product identification and information transmission, each unit has a unique ID logo, just as everyone has their own identity card.

ID number exception will make the subsequent decoder cannot be identified, the relevant information will not be able to pass. ID position offset is the main form of ID number anomaly. The current monitoring is mainly by the camera to identify, the offset value cannot be directly acquired, it can only be measured by manually move to the measure machine, and then manually fill. Take 5.5 inches for example, each substrate has about 500 ID numbers, it will take a lot of time for all manual measurement and compensation, that is not suitable for large-scale production needs.

SUMMARY OF THE DISCLOSURE

In order to overcome the shortcomings of the prior art, the present disclosure provides a complement method and a complement system of an identification number used in an engraving machine, so that the offset of the ID number can be automatically measured and feedback to the engraving machine for automatic complement, thereby improving the efficiency of both sides.

The present disclosure provides the complement method and system of the identification number used in the engraving machine, including the steps of:

sequentially acquiring a first distance a and a second distance g of a character located in a first digit of an identification number to an edge of an identification area in each identification area;

respectively subtracting the first distance a and the second distance g from a first preset value a' and a second preset value g', and acquiring an offset information in X-axis direction and Y-axis direction of the identification number in each identification area; and outputting the offset information and an identification area number corresponding to the offset information.

The method further includes writing the offset information to a position corresponding to the identification area number in a first supplementary data table according to the identification area number.

Before writing the offset information to a position corresponding to the identification area number in the first supplementary data table, the method further includes counting each offset information and the identification area number corresponding to the offset information, and establishing a second supplementary data table, and writing the offset information corresponding to the identification area number in the second supplementary data table to the position corresponding to the identification area number in the first supplementary data table.

Before writing the offset information to the position corresponding to the identification area number in the first supplementary data table, the method further includes counting each offset information and the identification area number corresponding to the offset information, establishing a second supplementary data table, and replacing the second supplementary data table with the first supplementary data table.

The first preset value a' and the second preset value g' are in the range of 100 to 300 μm.

The disclosure also provides an ID number complement system for an engraving machine, including:

a measuring device for sequentially acquiring a first distance a and a second distance g of a character located in a first digit of an identification number to an edge of an identification area in each identification area;

the first distance a and the second distance g are respectively subtracted from a first preset value a' and a second preset value g', and an offset information in X-axis direction and Y-axis direction of the identification number in each identification area is acquired;

the offset information and the identification area number corresponding to the offset information are outputted to a statistical process control system;

a statistical process control system for controlling an upper limit and a lower limit according to the offset information and outputting the identification area number corresponding to the offset information and the offset information to the engraving machine.

The engraving machine also writes the offset information to a position corresponding to the identification area number stored in the first supplementary data table of the engraving machine based on the identification area number.

Before the engraving machine writes the offset information to a position corresponding to the identification area number stored in the first supplementary data table of the engraving machine based on the identification area number, the measuring device also counts each offset information and the identification area number corresponding to the offset information, and outputs it to the statistical process control system after establishes the second supplementary data table, the statistical process control system sends the second supplementary data table to the engraving machine, and the engraving machine writes the offset information corresponding to the identification area number in the second supplementary data table to a position corresponding to the identification area number in the first supplementary data table.

Before the engraving machine writes the offset information to a position corresponding to the identification area number stored in the first supplementary data table of the engraving machine based on the identification area number, the measuring device calculates each offset information and the identification area number corresponding to the offset information, establishes the second supplementary data table and outputs it to the statistical process control system, the statistical process control system sends the second supplementary data table to the engraving machine, which replaces the second supplementary data table with the first supplementary data table.

The first preset value a' and the second preset value g' are in the range of 100 to 300 μm.

Compared with the prior art, the automatic measurement of the offset of the ID number can be achieved by acquiring the first distance a and the second distance g of the character located in the first digit of the identification number to the edge of the identification area in each identification area and respectively subtracting the first distance a and the second distance g from the first preset value a' and the second preset value g', and acquiring the offset information in X-axis direction and Y-axis direction of the identification number in each identification area and outputting the offset information and the identification area number corresponding to the offset information. By outputting the offset information to the engraving machine and complementing the value, the engraving machine is automatically complemented, and the work efficiency is improved by the above method.

BRIEF DESCRIPTION OF THE DRAWINGS

FIG. 1 is a schematic diagram of one of the identification area of the present disclosure;

FIG. 2 is a flow chart of the complement method of the present disclosure;

FIG. 3 is a block diagram of the complement system of the present disclosure;

Figure 4:
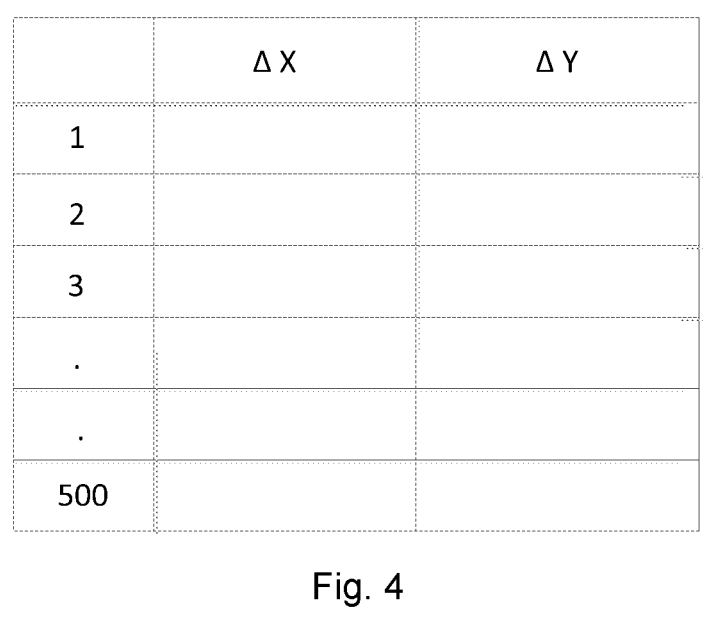

FIG. 4 is a schematic diagram showing the format of the first supplementary data table and the second supplementary data table of the present disclosure.

DETAILED DESCRIPTION OF PREFERRED EMBODIMENTS

The disclosure will now be described in further detail with reference to the accompanying drawings and examples.

As shown in FIG. 2, the ID number complement method for an engraving machine according to the present disclosure is characterized by including the steps of:

Sequentially acquiring the first distance a and the second distance g of the character located in the first digit of the identification number to the edge of the identification area in each identification area. Specifically, as shown in FIG. 1, the leftmost portion of the figure is the character of the first digit of the identification number. By measuring the first distance a of the character to the left edge of the identification area and the second distance g of the character to the upper and lower edges of the identification area. Since the distance from the character to the upper edge of the identification area and the distance from the character to the lower edge of the identification area are the same, only one of them is required.

Respectively subtracting the first distance a and the second distance g from the first preset value a' and the second preset value g', and acquiring the offset information ($\Delta X$, $\Delta Y$) in X-axis direction and Y-axis direction of the identification number in each identification area. Wherein the ($\Delta X$, $\Delta Y$) is a positive number. In particular, the first preset value a' and the second preset value g' are 100 to 300 μm. And outputting the offset information and the identification area number corresponding to the offset information. Specifically, the offset information is written to the position corresponding to the identification area number in the first supplementary data table based on the identification area number.

Before writing the offset information to the position corresponding to the identification area number in the first supplementary data table according to the identification area number, there are two ways to collect offset information, as follows:

One for: before writing the offset information to the position corresponding to the identification area number in the first supplementary data table, counting each offset information and the identification area number corresponding to the offset information, and establishing the second supplementary data table, and writing the offset information corresponding to the identification area number in the second supplementary data table to the position corresponding to the identification area number in the first supplementary data table. This method has the data can be collected and outputted, reduce the number of output and improve the efficiency.

The other is: before writing the offset information to the position corresponding to the identification area number in the first supplementary data table, counting each offset information and the identification area number corresponding to the offset information, establishing the second supplementary data table, and replacing the second supplementary data table with the first supplementary data table. In this way, the complement value can be saved, and the first supplementary data table can be quickly replaced by setting the second supplementary data table to the same format as the first supplementary data table.

In the present disclosure, the specific of the setting the second supplementary data table to the same format as the first supplementary data table is, the file suffix name (i.e. file extension) is the same, and the format of the file as shown in FIG. 2 is the same. The table contains at least three columns, n rows (here corresponding to the number of identification numbers), the first column of the three columns is the identification area number. The second column is the offset $\Delta X$ in X-axis direction, and the third column is the offset amount $\Delta Y$ in Y-axis direction.

As shown in FIG. 3, the ID number complement system for an engraving machine of the present disclosure includes a measuring device 1, a statistical process control system (SPC) 2 connected to the measuring device 1, and a engraving machine 3 connected to the SPC 2, wherein:

The measuring device 1 for sequentially acquiring the first distance a and the second distance g of the character located in the first digit of the identification number to the edge of the identification area in each identification area. Specifically, as shown in FIG. 1, the leftmost portion of the figure is the character of the first digit of the identification number. By measuring the first distance a of the character to the left edge of the identification area and the second distance g of the character to the upper and lower edges of the identification area. Since the distance from the character to the upper edge of the identification area and the distance from the character to the lower edge of the identification area are the same, only one of them is required.

Respectively subtracting the first distance a and the second distance g from the first preset value a' and the second preset value g', and acquiring the offset information ($\Delta X$, $\Delta Y$) in X-axis direction and Y-axis direction of the identification number in each identification area. Wherein the ($\Delta X$, $\Delta Y$) is a positive number. In particular, the first preset value a' and the second preset value g' are 100 to 300 μm.

The offset information and the identification area number corresponding to the offset information are outputted to the SPC 2.

The SPC 2 for controlling the upper limit and the lower limit according to the offset information and outputting the identification area number corresponding to the offset information and the offset information to the engraving machine 3. Specifically, the control of the upper limit and the lower limit of the meaning of the system allows the error, if the error in the control of the upper limit and the lower limit, can continue to engrave. When the upper and lower limits are exceeded, the SPC 2 will send a stop command to the engraving machine, thereby stopping all operations, which will facilitate repeating work and save repeating work costs.

The upper and lower limits of the control may be set as required, and may be set to ±100 μm.

After the SPC 2 outputs the offset information and the identification number corresponding to the offset information to the engraving machine 3, the engraving machine 3 writes the offset information into the position corresponding to the identification area number in the first supplementary data table of the engraving machine 3 based on the identification area number, thereby realizing the automatic complement.

Before the engraving machine 3 writes the offset information to the position corresponding to the identification area number stored in the first supplementary data table of the engraving machine 3 based on the identification area number, the measuring device 1 also counts each offset information and the identification area number corresponding to the offset information, and outputs it to the statistical process control system 2 after establishes the second supplementary data table, the statistical process control system 2 sends the second supplementary data table to the engraving machine 3, and the engraving machine 3 writes the offset information corresponding to the identification area number in the second supplementary data table to the position corresponding to the identification area number in the first supplementary data table.

In the above method, the format of the second supplementary data table is converted by the statistical process control system 2 before the second supplementary data table is transmitted to the engraving machine 3, converted into a format recognizable by the engraving machine 3. It is worth noting here that the format includes the file extension name.

Before the engraving machine 3 writes the offset information to the position corresponding to the identification area number stored in the first supplementary data table of the engraving machine 3 based on the identification area number, the measuring device 1 calculates each offset information and the identification area number corresponding to the offset information, establishes the second supplementary data table and outputs it to the statistical process control system 2, the statistical process control system 2 sends the second supplementary data table to the engraving machine 3, which replaces the second supplementary data table with the first supplementary data table.

In the above method, the format of the second supplementary data table is converted to the same file as the format of the first supplementary data table before the statistical process control system 2 transmits the second supplementary data table to the engraving machine 3. It is worth noting here that when the second supplementary data table is created, its tabular format is the same as the table format of the first supplementary data table, so that it can be replaced directly after the conversion is completed. The present disclosure is not limited thereto. For example, it is also possible to use a file having the same format as the first supplementary data table when establishing the second supplementary data table.

The specific of the setting the second supplementary data table to the same format as the first supplementary data table is, the file suffix name (i.e. file extension) is the same, and the format of the file as shown in FIG. 2 is the same. The table contains at least three columns, n rows (here corresponding to the number of identification numbers), the first column of the three columns is the identification area number. The second column is the offset ΔX in X-axis direction, and the third column is the offset amount ΔY in Y-axis direction.

In the present disclosure, the first supplementary data table and the second supplementary data table are Excel tables in the present disclosure.

In the present disclosure, the second supplementary data table may be uploaded in such a manner that the second supplementary data table is directly uploaded by the FTP (File Transfer Protocol). Of course, the present disclosure may employ other file uploading means, and the present disclosure is not limited thereto.

In the complement method and system of the present disclosure, the measuring device for acquiring the first distance a and the second distance g of the character located at the first digit of the identification number in the identification area to the edge of the identification area is AOI (Automatic Optic Inspection).

While the present disclosure has been shown and described with reference to specific embodiments. It will be understood by those skilled in the art that various changes in form and detail may be made therein without departing from the spirit and scope of the disclosure as defined by the appended claims and their equivalents.

What is claimed is:

1. A complement method of an identification (ID) number for an engraving machine, comprising the steps of:
    sequentially acquiring a first distance a and a second distance g of a character located in a first digit of the identification number marked in an identification area provided on a workpiece to an edge of the identification area on the workpiece in each identification area;
    respectively subtracting the first distance a and the second distance g from a first preset value a' and a second preset value g', acquiring an offset information in X-axis direction and Y-axis direction of the identification number in each identification area;
    outputting the offset information and an identification area number corresponding to the offset information;
    setting an upper limit and a lower limit of the offset information; and
    suspending operation of the engraving machine when the offset information exceeds the upper limit or the lower limit.

2. The complement method of the ID number for the engraving machine according to claim 1, wherein the method further comprises writing the offset information to a position corresponding to the identification area number in a first supplementary data table according to the identification area number.

3. The complement method of the ID number for the engraving machine according to claim 2, wherein before writing the offset information to a position corresponding to the identification area number in the first supplementary data table, the method further comprises counting each offset information and the identification area number corresponding to the offset information, and establishing a second supplementary data table, and writing the offset information corresponding to the identification area number in the second supplementary data table to the position corresponding to the identification area number in the first supplementary data table.

4. The complement method of the ID number for the engraving machine according to claim 3, wherein the first preset value a' and the second preset value g' are in the range of 100 to 300 μm.

5. The complement method of the ID number for the engraving machine according to claim 2, wherein before writing the offset information to the position corresponding to the identification area number in the first supplementary data table, the method further comprises counting each offset information and the identification area number corresponding to the offset information, establishing a second supplementary data table, and replacing the second supplementary data table with the first supplementary data table.

6. The complement method of the ID number for the engraving machine according to claim 5, wherein the first preset value a' and the second preset value g' are in the range of 100 to 300 μm.

7. The complement method of the ID number for the engraving machine according to claim 1, wherein the first preset value a' and the second preset value g' are in the range of 100 to 300 μm.

8. The complement method of the ID number for the engraving machine according to claim 2, wherein the first preset value a' and the second preset value g' are in the range of 100 to 300 μm.

9. An identification (ID) number complement system for the engraving machine, comprising:
a measuring device for sequentially acquiring a first distance a and a second distance g of a character located in a first digit of an identification number marked in an identification area provided on a workpiece to an edge of the identification area on the workpiece in each identification area;
the first distance a and the second distance g are respectively subtracted from a first preset value a' and a second preset value g', and an offset information in X-axis direction and Y-axis direction of the identification number in each identification area is acquired;
the offset information and an identification area number corresponding to the offset information are outputted to a statistical process control system; and
a statistical process control system for setting an upper limit and a lower limit according to the offset information, outputting the offset information and the identification area number corresponding to the offset information to the engraving machine and suspending operation of the engraving machine when the offset information exceeds the upper limit or the lower limit.

10. The ID number complement system for the engraving machine according to claim 9, wherein the engraving machine also writes the offset information to a position corresponding to the identification area number stored in a first supplementary data table of the engraving machine based on the identification area number.

11. The ID number complement system for the engraving machine according to claim 10, wherein before the engraving machine writes the offset information to a position corresponding to the identification area number stored in the first supplementary data table of the engraving machine based on the identification area number, the measuring device also counts each offset information and the identification area number corresponding to the offset information, and outputs it to the statistical process control system after establishes a second supplementary data table, the statistical process control system sends the second supplementary data table to the engraving machine, and the engraving machine writes the offset information corresponding to the identification area number in the second supplementary data table to the position corresponding to the identification area number in the first supplementary data table.

12. The ID number complement system for the engraving machine according to claim 11, wherein the first preset value a' and the second preset value g' are in the range of 100 to 300 μm.

13. The ID number complement system for the engraving machine according to claim 10, wherein before the engraving machine writes the offset information to a position corresponding to the identification area number stored in the first supplementary data table of the engraving machine based on the identification area number, the measuring device calculates each offset information and the identification area number corresponding to the offset information, establishes a second supplementary data table and outputs it to the statistical process control system, the statistical process control system sends the second supplementary data table to the engraving machine, which replaces the second supplementary data table with the first supplementary data table.

14. The ID number complement system for the engraving machine according to claim 13, wherein the first preset value a' and the second preset value g' are in the range of 100 to 300 μm.

15. The ID number complement system for the engraving machine according to claim 9, wherein the first preset value a' and the second preset value g' are in the range of 100 to 300 μm.

16. The ID number complement system for the engraving machine according to claim 10, wherein the first preset value a' and the second preset value g' are in the range of 100 to 300 μm.

* * * * *